(12) United States Patent
Hirata et al.

(10) Patent No.: US 7,151,385 B2
(45) Date of Patent: Dec. 19, 2006

(54) CONTACT PROBE, METHOD OF MANUFACTURING THE CONTACT PROBE, AND DEVICE AND METHOD FOR INSPECTION

(75) Inventors: Yoshihiro Hirata, Hyogo (JP); Tsuyoshi Haga, Hyogo (JP); Toshiyuki Numazawa, Hyogo (JP); Kazuo Nakamae, Hyogo (JP); Kazunori Okada, Hyogo (JP); Jun Yorita, Hyogo (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/470,399

(22) PCT Filed: Jan. 22, 2002

(86) PCT No.: PCT/JP02/00444

§ 371 (c)(1),
(2), (4) Date: Dec. 8, 2003

(87) PCT Pub. No.: WO02/061439

PCT Pub. Date: Aug. 8, 2002

(65) Prior Publication Data

US 2004/0075454 A1    Apr. 22, 2004

(30) Foreign Application Priority Data

| Jan. 29, 2001 | (JP) | ............................ 2001-019471 |
| May 7, 2001 | (JP) | ............................ 2001-136192 |
| Aug. 6, 2001 | (JP) | ............................ 2001-237540 |
| Nov. 22, 2001 | (JP) | ............................ 2001-357763 |

(51) Int. Cl.
  *G01R 31/02* (2006.01)
  *H01K 3/10* (2006.01)

(52) U.S. Cl. ........................................ 324/754; 29/825
(58) Field of Classification Search ................ 324/765, 324/158.1, 754; 29/825, 830, 846, 593, 595
See application file for complete search history.

(56) References Cited

U.S. PATENT DOCUMENTS 3,904,461 A * 9/1975 Estep et al. .................... 216/16
4,878,294 A * 11/1989 Dugan et al. ................. 29/852

(Continued)

FOREIGN PATENT DOCUMENTS

DE    19957326    5/2000

(Continued)

OTHER PUBLICATIONS

J. P. Rasmussen et al., "Fabrication of an All-Metal Atomic Force Microscope Probe", Proceedings of International Solid State Sensors and Actuators Conference (Transducers '97), Jun. 16-19, 1997, Chicago, IL, USA, vol. 1, pp. 463-466.

*Primary Examiner*—Jermele Hollington
*Assistant Examiner*—Tung X. Nguyen
(74) *Attorney, Agent, or Firm*—W. F. Fasse; W. G. Fasse

(57) ABSTRACT

A method of manufacturing a contact probe includes an electroforming step of, using a resist film (522) arranged on a substrate (521) as a pattern frame having a shape corresponding to a contact probe, performing electroforming to fill a gap in the resist film (522) to form a metal layer (526), a tip end shaping step of obliquely removing and sharpening that part of the metal layer (526) which serves as a tip end portion of the contact probe, and a take-out step of taking out only the metal layer (526) from the pattern frame.

9 Claims, 17 Drawing Sheets

U.S. PATENT DOCUMENTS

| | | | |
|---|---|---|---|
| 5,021,364 A | | 6/1991 | Akamine et al. |
| 5,027,062 A | * | 6/1991 | Dugan et al. ............... 324/754 |
| 5,513,430 A | * | 5/1996 | Yanof et al. .................. 29/846 |
| 5,989,994 A | | 11/1999 | Khoury et al. |
| 6,469,394 B1 | * | 10/2002 | Wong et al. ................ 257/780 |
| 6,553,662 B1 | * | 4/2003 | Sedberry ..................... 29/849 |

FOREIGN PATENT DOCUMENTS

| | | |
|---|---|---|
| JP | 57178174 | 11/1982 |
| JP | 06300778 | 10/1994 |
| JP | 07273157 | 10/1995 |
| JP | 11337575 | 12/1999 |
| JP | 2000046870 | 2/2000 |
| JP | 2000162241 | 6/2000 |
| JP | 2000164407 | 6/2000 |
| JP | 2000228262 | 8/2000 |
| JP | 2000292436 | 10/2000 |
| JP | 2001004798 | 1/2001 |
| JP | 2001013163 | 1/2001 |
| JP | 2001052827 | 2/2001 |
| JP | 2001116765 | 4/2001 |
| JP | 2001332323 | 11/2001 |
| WO | WO 00/33089 | 6/2000 |

* cited by examiner

CONTACT PROBE, METHOD OF MANUFACTURING THE CONTACT PROBE, AND DEVICE AND METHOD FOR INSPECTION

RELATED APPLICATION DATA

This application is a national stage 371 of PCT/JP02/00444 filed Jan. 22, 2002.

TECHNICAL FIELD

The present invention relates to a contact probe for use with a test apparatus for performing an electrical test of a circuit under test such as a semiconductor substrate and a liquid crystal display, and a method of manufacturing the same. The present invention also relates to a test apparatus and a test method.

BACKGROUND ART

A test of a circuit formed on a semiconductor substrate or a liquid crystal display is generally performed using a test apparatus with an electrode portion (which is called, for example, a probe card) having a number of contacts (or contact needles) called contact probes being arranged correspondingly to a circuit pattern to be tested. Miniaturization of contact probes has been required, and as disclosed in Japanese Patent Laying-Open No. 2000-162241, for example, it is possible to manufacture a ultra-fine contact probe having a thickness of 0.1 mm or less by a combined method of lithography and electroforming. Conventionally, Japanese Patent Application No. 2000-164407 has proposed a structure of each contact probe, as shown in FIG. 35. In this contact probe, a tip end portion 501 is supported by a spring portion 502. This is formed by lithography and electroforming using a mask having a pattern as shown in FIG. 36.

Similarly, a method of manufacturing a probe using lithography and electroforming is also disclosed in Japanese Patent Laying-Open No. 11-337575 and the like.

In many cases, the surface of a circuit under test is generally provided with an insulating film such as an oxide film. In a test, it is necessary to break the insulating film such as a natural oxide film formed on the surface of the circuit under test, in order to assure electrical contact. A contact pressure is desirably increased to some extent in order to break the insulating film. For this purpose, at the tip end of the contact probe, as shown in FIG. 37, for example, a tip end portion 501a may be sharpened.

In a method of forming a conductive contact probe by lithography and electroforming, however, as a three-dimensional shape is formed based on a two-dimensional pattern, even using the pattern as shown in FIG. 37, tip end portion 501a that is a projection of the tip end of the resultant contact probe is actually shaped like a triangular prism as shown in FIG. 38, providing linear contact. It has also been proposed to manufacture a contact probe as shown in FIG. 40 using a mask as shown in FIG. 39. In this case, a tip end portion 501b is also shaped like triangular prism, providing linear contact. In other words, point contact cannot be achieved and therefore the contact pressure cannot be increased above a prescribed level.

Furthermore, while the contact pressure has to be increased to some extent in order to break through the insulating film, the finer the contact probe becomes, the weaker the contact probe itself becomes, making it difficult to increase a load. Moreover, application of a high pressure is also unfavorable for the substrate under test.

As an approach to effectively break the insulating film, for example, Japanese Patent Laying Open No. 2000-292436 has proposed a mechanism for rotating a contact probe itself. Such a method, however, requires a combination of multiple components, which would complicates the structure, thereby making miniaturization difficult and also increasing the cost, inevitably.

The tip end of the contact probe is advantageously sharp like a needle. In the method of manufacturing a contact probe by lithography and electroforming, a three-dimensional shape is manufactured using a die fabricated based on a two-dimensional mask. Therefore, even if the contact probe is produced using the pattern with an open window having the shape as shown in FIG. 41A, for example, a projection portion 91 at the tip end is shaped like a triangular prism, as perspectively shown in FIG. 41B. In other words, linear contact is provided on the test circuit, which increases the contact area. Therefore, the probe has to be brought into contact under an excessively high contact pressure to break through the insulating film, and additional shaping process is required to obtain a needle-like tip end.

DISCLOSURE OF THE INVENTION

An object of the first invention is to provide a contact probe having a sharper tip end portion enabling point contact, and a method of manufacturing the same.

An object of the second invention is to provide a structure of a contact probe capable of breaking through a surface of a circuit under test even with a low contact pressure to achieve appropriate electrical contact, and a method of manufacturing the same, as well as a test apparatus and a test method using the contact probe.

In order to achieve the aforementioned object, based on the first invention, a contact probe having a tip end portion, is formed of an electroforming metal layer grown in a direction in accordance with a certain pattern. The tip end portion is sharpened by being provided with a slope formed by machining that intersects obliquely with respect to a growing direction of the electroforming. By employing such a configuration, a sharpened tip end portion attains point contact with an object of measurement, rather than linear contact, thereby increasing a contact pressure.

In order to achieve the aforementioned object, a method of manufacturing a contact probe based on the first invention includes: an electrotorming step of, using a pattern frame having a shape corresponding to a contact probe and arranged on a substrate, performing electroforming to fill a gap of the pattern frame to form a metal layer; a tip end shaping step of obliquely removing and sharpening that part of the metal layer which serves as a tip end portion of the contact probe; and a take-out step of taking out only the metal layer from the pattern frame. By employing this configuration, the tip end part, which has conventionally formed a triangular prism, can form a quadrangular pyramid, and a tip end portion sharper than the conventional tip end part can be formed. As a result, point contact with an object of measurement can be achieved, rather than linear contact, thereby increasing a contact pressure.

In the aforementioned invention, preferably, the tip end shaping step is performed by cutting a boundary between the pattern frame and the metal layer using a rotary cutting edge having an outer edge V-shaped in cross section. By employing this configuration, a slope can be formed simply by cutting straightly at the tip end portion of the contact probe.

In the aforementioned invention, preferably, the tip end of the metal layer is cut by electrical discharge machining in the tip end shaping step. By employing this configuration, the part serving as the tip end portion of the contact probe can be shaped precisely without being deformed by a load.

In the aforementioned invention, preferably, the tip end shaping step includes a step of providing a projection using an electrical discharge machining mark on a machined surface formed by the electrical discharge machining. By employing this configuration, a projection is formed at the tip end portion of the contact probe, thereby increasing a contact pressure.

In the aforementioned invention, preferably, the machined surface is covered with a metal having an electric resistance smaller than that of a material forming a surface of the machined surface and having a hardness higher than that of the surface of the machined surface. By employing this configuration, an increased mechanical strength of the minute projection can prevent the contact part of the minute projection from being crushed by the pressure at the time of contact, and the electrical contact can be improved at the same time.

In the aforementioned invention, preferably, the pattern frame is formed by forming a pattern by lithography on a resist film formed on the substrate. By employing this configuration, the pattern frame can be formed precisely.

In the aforementioned invention, preferably, the pattern frame is made of a resin molded using a metal die. By employing this configuration, a number of pattern frames can easily be formed, thereby improving productivity.

In order to achieve the aforementioned object, in accordance with a first aspect, a contact probe based on the second invention is formed of a tip end portion approximately cylindrical as a whole in shape, having at one end a contact end to come into contact with a circuit under test, and a base portion provided to be opposed to and kept apart from the other end that is opposite to the contact end of the tip end portion. By pressing the tip end portion into contact with a circuit under test, the tip end portion and the base portion are brought into contact with each other, and further pushing causes dislocation at the contact surfaces so that the tip end portion is moved in a direction parallel to a surface of the circuit under test. Therefore, when the contact probe is pressed into contact with the circuit under test, the contact end of the contact probe is moved such that it scrapes off the surface of the circuit under test to break the insulating film on the surface, resulting in reliable contact with the circuit under test. Here, the other end that is opposite to the contact end of the tip end portion may form an end surface forming an angle that is not a right angle to a cylindrical axis of the tip end portion, and an end surface of the base portion that is opposed to the other end may be parallel to the end surface of the tip end portion. The opposed end surfaces of the tip end portion and the base portion are pressed against each other when pressed into contact with each other, and further pushing causes the tip end portion to be moved to the direction in which the surfaces are shifted from each other, thereby resulting in the aforementioned effect. Although the opposed surfaces are preferably planar surfaces parallel to each other to facilitate manufacturing, they may not be parallel, for example, a combination including either one shaped like a projection, as long as the tip end portion and the base portion are relatively moved in the direction parallel to the surface of the circuit under test. Desirably, the tip end portion and the base portion are coupled to each other by a conductive and elastic coupling portion, and the tip end portion, the base portion and the coupling portion are integrally formed. Therefore, a desired contact probe can be obtained in one-piece without combining a plurality of components, thereby resulting in miniaturization and cost reduction. Here, as already known, manufacturing by lithography and electroforming is a method of filling a concave portion of a die with a metal by electroforming, where the die is fabricated by exposure of ultraviolet and X-rays and etching using a mask having a desired shape. It also includes a method of manufacturing contact probes by electroforming using their respective resin dies, where a plurality of resin dies are manufactured using a metal die fabricated by lithography and electroforming as a prototype. By doing so, contact probes can be mass-manufactured inexpensively without increasing the number of times of lithography.

In accordance with a second aspect, a contact probe based on the second invention is formed of a tip end portion approximately cylindrical in shape, having at one end a contact end to be in contact with a circuit under test, a tubular base portion provided concentrically with a cylindrical axis of the tip end portion, and a plurality of coupling portions coupling the tip end portion to the base portion. Each of the coupling portions is curved on a plane forming a right angle to an axis direction of the tip end portion, and by pressing the tip end portion in contact with the circuit under test, the tip end portion is rotated about the axis thereof. Such a simple structure provides rotation of the tip end portion, which allows the contact end to break through the insulating film of the surface of the circuit under test, resulting in a good contact. Furthermore, a simple structure only formed of the tip end portion, the base portion, and the coupling portion therebetween results in a small and inexpensive contact probe.

In accordance with a third aspect, a contact probe based on the third invention is formed of a body portion having a contact end to be into contact with a circuit under test, and at least one support portion positioned in the vicinity of the body portion. The support portion is arranged to come into contact with the circuit under test together with the body portion when the body portion is pressed into contact with the circuit under test, and the support portion has a spring modulus lower than that of the body portion in a pressing direction. When the contact end that is the tip end of the contact probe is pressed into contact with the circuit under test, the contact end slides on the insulating film formed on the surface of the circuit under test, resulting in that a contact pressure that would allow breakage of the insulating film for good contact may not be exerted effectively. In the configuration as described above, the support portion is pressed against the surface of the circuit under test with the contact end being in contact, thereby preventing traverse sliding of the contact portion to allow the contact portion to be pressed against the circuit vertically. Although this configuration alone is effective, it is more effective when used together with the first and second configurations as described above.

In accordance with a fourth aspect of a contact probe based on the second invention, a reduction gas channel is provided for blowing a reduction gas to a part to be in contact with a circuit under test. A reduction gas is a gas effective in removing an oxide insulating film on the surface of the circuit under test, and includes chlorine gas, fluorine gas, or the like. The reduction gas blown to the contact portion can remove the insulating film around the contact portion, thereby resulting in good contact. Although the reduction gas may act upon the entire surface of the circuit under test, a channel for blowing the gas only to the contact portion may allow removal of the insulating film effectively with a small amount of gas, thereby minimizing the effect of the reduction gas on the other components.

In order to achieve the aforementioned object, in accordance with a first aspect, a test apparatus based on the second invention includes any of the contact probes described above. By employing such a configuration, even when the surface of the circuit under test is covered with an oxide film, the tip end of the contact probe scrapes off the oxide film to ensure conduction, allowing the test apparatus to perform a test.

In accordance with a second aspect, a test apparatus based on the second invention includes reduction gas introducing means for bringing a circuit under test into contact with a reduction gas, and a contact probe to be in contact with the circuit under test in an atmosphere of the reduction gas. By employing this structure, even if the surface of the circuit under test is covered with an oxide film, the reduction gas can remove the oxide film, thereby resulting in a test apparatus that allows more reliable conduction when the contact probe comes into contact.

In one aspect of the present test apparatus, preferably, the contact probe may include a body portion having a contact end to be in contact with the circuit under test, and a reduction gas channel provided adjacent to the body portion to blow the reduction gas to a part where the contact end comes into contact with the circuit under test. By doing so, the reduction gas can be blown intensively only on the part requiring the reduction gas, so that even a small amount of the reduction gas can be used effectively. Alternatively, in another aspect, the present test apparatus preferably includes a chamber for holding both the circuit under test and the contact probe in an atmosphere of the reduction gas. Thus, even without the arrangement of the reduction gas channel for blowing the reduction gas, the circuit under test can be brought into contact with the reduction gas reliably.

In order to achieve the aforementioned object, a test method based on the second invention is performed by arranging a circuit under test in a reduction gas and bringing a contact probe into contact with the test circuit for electrical conduction. By employing this method, even when the surface of the circuit under test is covered with an oxide film, the reduction gas can remove the oxide film, thereby resulting in a test method that provides conduction more reliably when the contact probe comes into contact.

In the test method, preferably, the contact probe is manufactured by performing lithography and electroforming. Specifically, a contact probe that is manufactured by lithography and electroforming is often used for a test of a high-density, fine circuit and then confronts the existence of the oxide film. On the contrary, in the present invention, since a test is performed while the oxide film is being removed in the reduction gas environment, more reliable conduction is provided and a precise test can be performed effectively. Although a nozzle may be arranged beside each contact probe to blow the reduction gas, it is difficult in a test of a high-density, fine circuit to install a nozzle in a limited area in which a contact probe may be arranged. Therefore, it is more preferable to eliminate the need for a nozzle for each contact probe by placing the test environment itself in the reduction gas, rather than to install a nozzle for blowing the reduction gas. In this test method, it is unnecessary to install a nozzle, and therefore the density of contact probes can be increased.

BEST MODES FOR CARRYING OUT THE INVENTION

FIRST EMBODIMENT

Referring to FIGS. 1–9, a method of manufacturing a contact probe of a first embodiment based on the first invention will be described.

First, a resist film 522 is formed on an upper surface of a conductive substrate 521. A metal substrate including SUS, Cu, Al, or the like, an Si substrate, a glass substrate, or the like can be used as substrate 521. It is noted that in the case of an Si substrate, a glass substrate, or the like, a metal layer of Ti, Al, Cu, Ni, Mo, or a combination thereof is formed in advance on the upper surface of substrate 521 by sputtering to serve as an underlying conductive layer 527. Alternatively, even in the case of using a metal substrate, the underlying conductive layer may be formed by sputtering or the like on the metal substrate as necessary. In the following, description will be made with reference to the figures, assuming that underlying conductive layer 527 is present.

Figure 1:
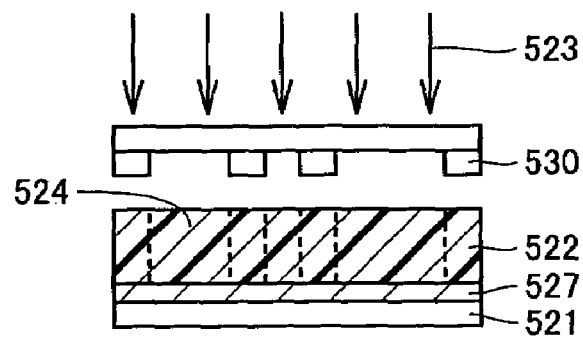
FIG. 1 is an illustration of a first step in a method of manufacturing a contact probe in a first embodiment based on the first invention.
Figure 2:
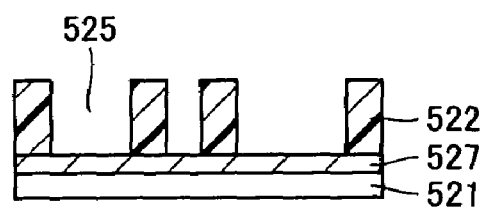
FIG. 2 is an illustration of a second step in the method of manufacturing a contact probe in the first embodiment based on the first invention.

As shown in FIG. 1, using a mask 530, the surface of resist film 522 is irradiated with X-rays 523 from a synchrotron radiation facility. Here, a method using X-ray lithography is employed, while UV lithography with radiation of UV (ultraviolet) may be used instead of X-rays. In any case, after development, the resist in an exposure part 524 is removed. As a result, as shown in FIG. 2, a pattern frame having a concave portion 525 is formed.

Figure 3:
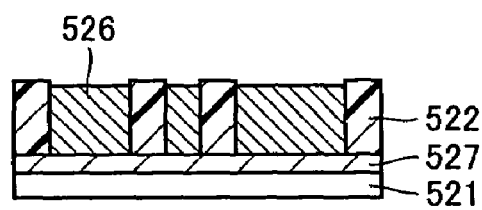
FIG. 3 is an illustration of a third step in the method of manufacturing a contact probe in the first embodiment based on the first invention.
Figure 4:
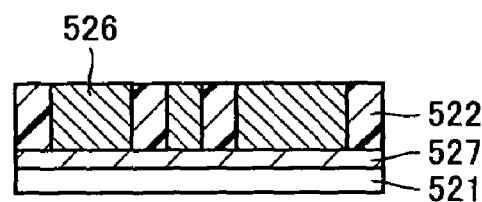
FIG. 4 is an illustration of a fourth step in the method of manufacturing a contact probe in the first embodiment based on the first invention.

As shown in FIG. 3, electroforming is performed to fill concave portion 525 with a metal layer 526. As a material of metal layer 526, nickel, cobalt, copper, or an alloy such as Ni—Co, Ni—Mn, Ni—Mo, Ni—W, Co—Mo, Co—W, or the like can be used. Thereafter, as shown in FIG. 4, the upper surface is ground or polished to attain a uniform thickness as desired.

Figure 5:
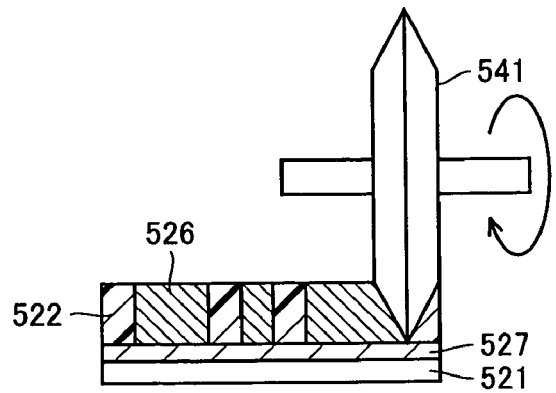
FIG. 5 is an illustration of a fifth step in the method of manufacturing a contact probe in the first embodiment based on the first invention.
Figure 6:
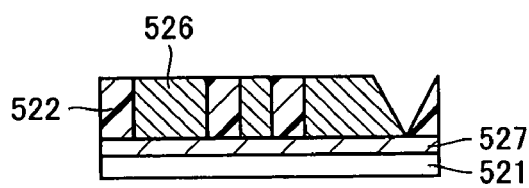
FIG. 6 is an illustration of a sixth step in the method of manufacturing a contact probe in the first embodiment based on the first invention.

As shown in FIG. 5, a rotary cutting edge 541 with an outer edge having a V-shaped cross section is rotated to run through a boundary between a part serving as a tip end portion of the contact probe and resist film 522, so that the part serving as the tip end portion is obliquely cut off from metal layer 526 in such a manner that a groove having a V-shaped cross section is formed. Thus, the structure shown in FIG. 6 results. Rotary cutting edge 541 as used herein includes, for example, a dicer.

Figure 7:
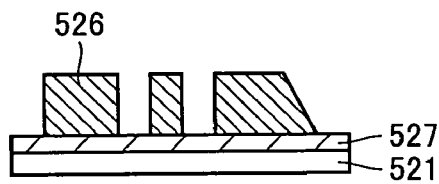
FIG. 7 is an illustration of a seventh step in the method of manufacturing a contact probe in the first embodiment based on the first invention.
Figure 8:
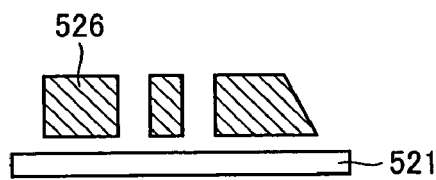
FIG. 8 is an illustration of an eighth step in the method of manufacturing a contact probe in the first embodiment based on the first invention.
Figure 9:
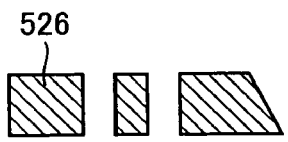
FIG. 9 is an illustration of a ninth step in the method of manufacturing a contact probe in the first embodiment based on the first invention.

As shown in FIG. 7, resist film 522 left on substrate 521 is removed by ashing or development after re-radiation. As shown in FIG. 8, underlying conductive layer 527 is removed by etching or the like. Alternatively, if there is no underlying conductive layer 527 and substrate 521 is a metal substrate, substrate 521 is removed by etching or the like. Either wet-etching or dry-etching may be used to remove underlying conductive layer 527 or substrate 521. As shown in FIG. 9, a contact probe is obtained by taking out only metal layer 526.

Figure 10A:
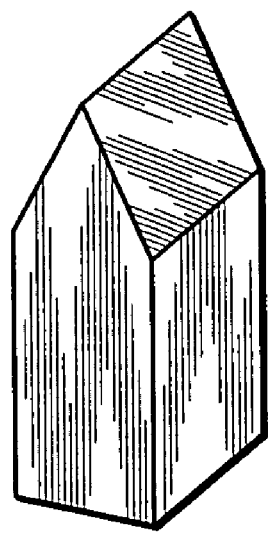
FIG. 10A is a perspective view of a tip end portion of a conventional contact probe.
Figure 10B:
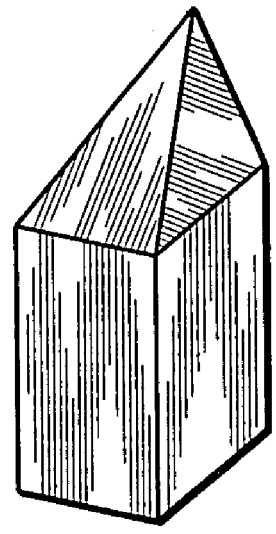
FIG. 10B is a perspective view of a tip end portion of a contact probe in the first embodiment based on the first invention.

Since rotary cutting edge 541 having an outer edge V-shaped in cross section cuts the part serving as the tip end portion obliquely from metal layer 526, the tip end portion, which was conventionally shaped as shown in FIG. 10A, can be shaped as shown in FIG. 10B. In other words, by cutting off the corner obliquely from one side, the part which would otherwise be a triangular prism can be made a quadrangular pyramid. When used as a contact probe, such a shape that is sharp at the tip end can provide point contact rather than linear contact with an object of measurement, thereby increasing a contact pressure.

It is noted that the shaping of the tip end portion by cutting-off is performed after grinding or polishing in the present embodiment, although it may be performed before grinding or polishing. Here, resist 522 and metal layer 526 are cut together by rotary cutting edge 541, although only metal layer 526 may be cut after being taken out.

It is noted that any shaping means may be used other than rotary cutting edge 541 as long as it can cut off the tip end portion obliquely. For example, turning, grinding, or the like may be contemplated.

Figure 11:
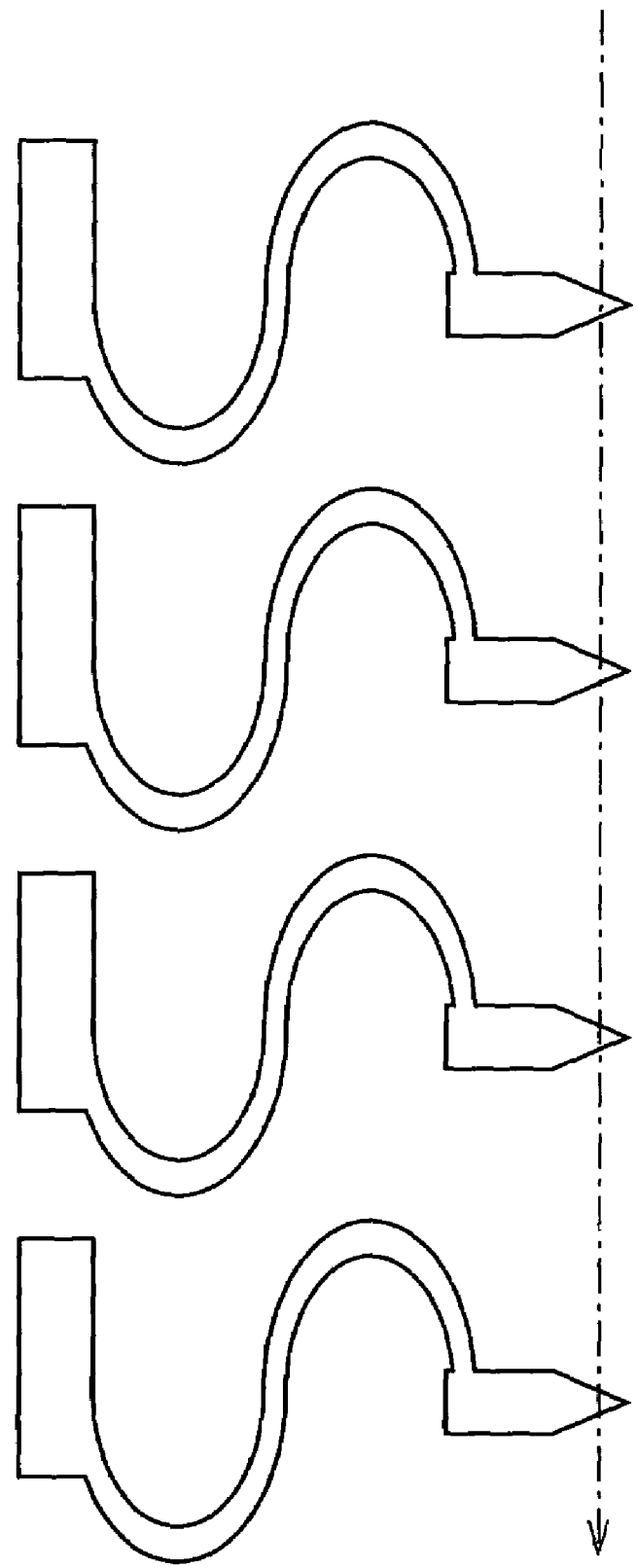
FIG. 11 is an illustration for a track of a rotary cutting edge in the method of manufacturing a contact probe in the first embodiment based on the first invention.

The pattern frame is not limited to the one having a shape including one contact probe and may have a pattern including the shapes of a plurality of contact probes all together as shown in FIG. 11. In such a case, as shown in FIG. 11, an arrangement in which the tip end portions of the contact probes are arranged in a straight line is desirable in that the shaping of the tip end portions of the contact probes can be performed at a time simply by moving rotary cutting edge 541 on a track as indicated by the chain line.

Figure 12:
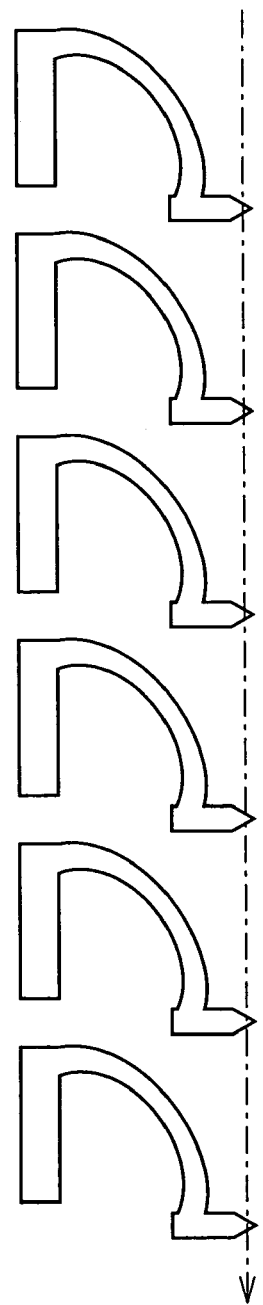
FIG. 12 is an illustration showing another exemplary shape, with the trace of the rotary cutting edge in the method of manufacturing a contact probe in the first embodiment based on the first invention.

The first invention relates to shaping of the tip end portion and may be applicable irrespective of the shape of spring. For example, in FIG. 11, the spring is S-shaped, while a plurality of S-shaped springs, rather than one spring, may be arranged in succession to form a corrugate shape. Furthermore, other than the example shown in FIG. 11, the contact probe having a shape as shown in FIG. 12 can be shaped similarly simply by moving rotary cutting edge 541 on the track as indicated by the chain line.

SECOND EMBODIMENT

Referring to FIGS. 13–21, 8 and 9, a method of manufacturing a contact probe in a second embodiment based on the first invention will be described.

Figure 13:
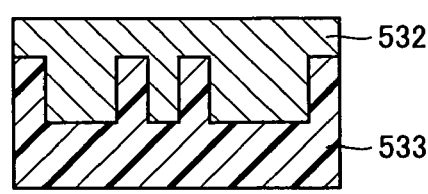
FIG. 13 is an illustration of a first step in the method of manufacturing a contact probe in a second embodiment based on the first invention.
Figure 14:
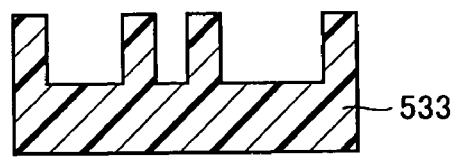
FIG. 14 is an illustration of a second step in the method of manufacturing a contact probe in the second embodiment based on the first invention.
Figure 15:
FIG. 15 is an illustration of a third step in the method of manufacturing a contact probe in the second embodiment based on the first invention.
Figure 16:
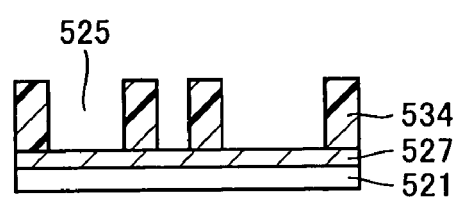
FIG. 16 is an illustration of a fourth step in the method of manufacturing a contact probe in the second embodiment based on the first invention.
Figure 17:
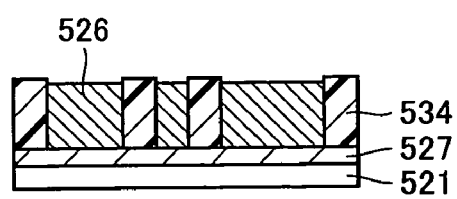
FIG. 17 is an illustration of a fifth step in the method of manufacturing a contact probe in the second embodiment based on the first invention.
Figure 18:
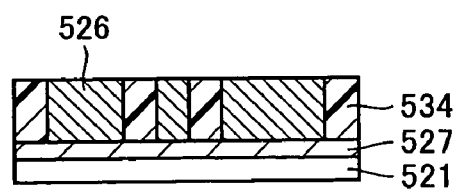
FIG. 18 is an illustration of a sixth step in the method of manufacturing a contact probe in the second embodiment based on the first invention.

As shown in FIG. 13, using a metal die 532 having convexity as the shape of the contact probe, a resin die 533 is formed by injection molding. As a result, a resin die 533 having concavity as the shape of the contact probe results. This resin die 533 is polished so that the concave portion is penetrated in order to fabricate a resin pattern frame 534 as shown in FIG. 15. As shown in FIG. 16, substrate 521 having underlying conductive layer 527 formed on the upper surface thereof is prepared, as in the first embodiment, and resin pattern frame 534 is affixed on the upper surface thereof. As described in the first embodiment, underlying conductive layer 527 may be omitted if substrate 521 is a metal substrate. The concave portion may be penetrated after resin die 533 is affixed to substrate 521 (not shown). As shown in FIG. 17, electroforming is performed to fill concave portion 525 with metal layer 526. The conditions of the material of metal layer 526 are similar as described in the first embodiment. Thereafter, as shown in FIG. 18, the upper surface is ground or polished to attain a uniform thickness as desired.

Figure 19:
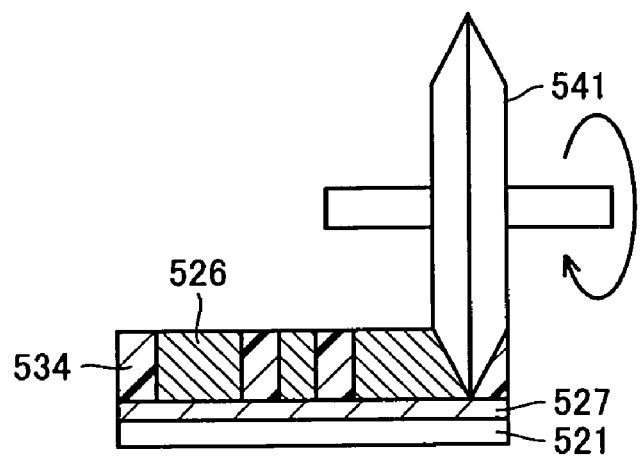
FIG. 19 is an illustration of a seventh step in the method of manufacturing a contact probe in the second embodiment based on the first invention.
Figure 20:
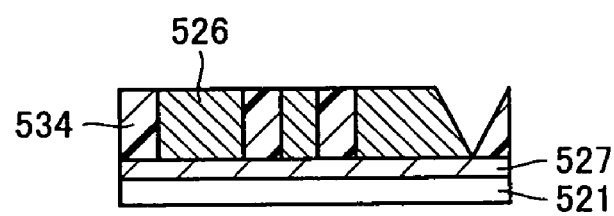
FIG. 20 is an illustration of an eighth step in the method of manufacturing a contact probe in the second embodiment based on the first invention.

As shown in FIG. 19, rotary cutting edge 541 having an outer edge V-shaped in cross section is rotated to run through the boundary between the part serving as the tip end portion of the contact probe and the resin pattern frame 534, so that the part serving as the tip end portion of metal layer 526 is cut off obliquely in such a manner that a groove having a V-shaped cross section is formed. Thus, the structure shown in FIG. 20 results.

Figure 21:
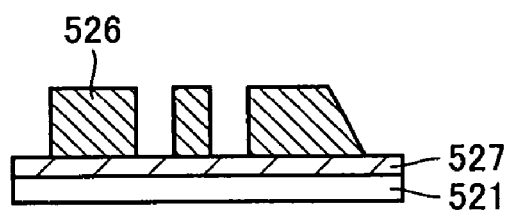
FIG. 21 is an illustration of a ninth step in the method of manufacturing a contact probe in the second embodiment based on the first invention.

As shown in FIG. 21, resin pattern frame 534 left on substrate 521 is removed by ashing or development after re-radiation. Thereafter, the same process as in the manufacturing method in the first embodiment will follow. Namely, as shown in FIG. 8, underlying conductive layer 527 is removed by etching or the like. As described in the first embodiment, substrate 521 is removed by etching or the like if there is no underlying conductive layer 527. Underlying conductive layer 527 or substrate 521 may be removed by either wet-etching or dry-etching. As shown in FIG. 9, a contact probe is obtained by taking out only metal layer 526.

In this manufacturing method, a contact probe having a sharp tip end can also be manufactured as in the first embodiment. Therefore, the contact probe as used can be brought into point contact with an object of measurement rather than linear contact, thereby increasing a contact pressure.

THIRD EMBODIMENT

Referring to FIGS. 1–4, 22, 23, and 7–9, a method of manufacturing a contact probe in a third embodiment based on the first invention will be described.

Figure 22:
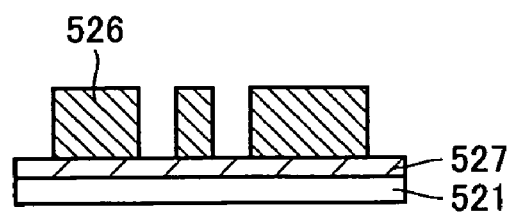
FIG. 22 is an illustration of a fifth step in the method of manufacturing a contact probe in a third embodiment based on the first invention.
Figure 23:
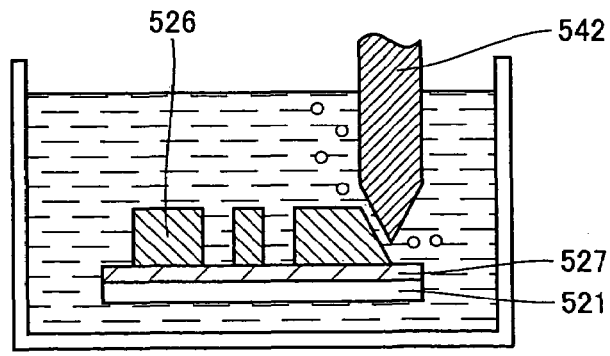
FIG. 23 is an illustration of a sixth step in the method of manufacturing a contact probe in the third embodiment based on the first invention.

The steps shown in FIGS. 1–4 are the same as described in the first embodiment. As shown in FIG. 4, the upper surface of metal layer 526 is ground or polished to attain a uniform thickness as desired, in the present embodiment, followed by ashing to remove resist film 522, as shown in FIG. 22. As shown in FIG. 23, electrical discharge machining is performed using an electrical discharge machining electrode 542. Electrical discharge machining electrode 542 is an electrode having a tip end formed into a conical shape or a V-shape. In this electrical discharge machining, a machined surface is formed obliquely with respect to the part serving as the tip end portion of the contact probe.

In the example shown in FIG. 23, electrical discharge machining is performed with metal layer 526 being affixed on substrate 521, although metal layer 526 may be taken out from substrate 521 before electrical discharge machining. Furthermore, although, in the example shown in FIG. 23, the tip end portion of the contact probe is shaped in such a manner that it is cut away obliquely from one side as shown in FIG. 10B, the tip end portion may be shaped like a quadrangular pyramid by performing respective electrical discharge machinings on both front and back surfaces of metal layer 526 serving as a contact probe. Although the electrical discharge machining has been shown herein as die sinking electric discharge machining using electrical discharge machining electrode 524, by way of example, wire electric discharge machining may be employed as long as the tip end portion can be shaped in the similar manner.

In the electrical discharge machining, a number of electrical discharge machining marks are formed over the entire machined surface. Each of electrical discharge machining marks is a crater-like mark formed of a metal that is melted in an extremely small range on a work-piece surface and is then scattered. The periphery of each crater has a minute projection created when scattered. Therefore, the electrical discharge machining mark can be used to leave a minute projection on the machined surface.

After shaping the tip end portion by electrical discharge machining, the similar process as described in the first embodiment with reference to FIGS. 7–9 is performed. As a result, the contact probe as shown in FIG. 9 results.

As described above, when the tip end portion of the contact probe is formed by electrical discharge machining, the effect similar to that in the first embodiment results with the following additional effects. Namely, the minute projection obtained from the electrical discharge machining mark on the machined surface can increase the contact pressure when used as the contact probe. This is because when the minute projection as the contact probe is pressed against the object, the minute projection, rather than the machined surface itself, first comes into abutment with the object, thereby reducing the contact area.

Additionally, the tip end portion of the contact probe having this minute projection may be covered with a metal having a hardness higher than that of the machined surface and having an electric resistance smaller than that of the material forming the machined surface. Such a metal includes Pd (palladium) or Rh (rhodium), for example. By covering the tip end portion of the contact probe with the metal, the mechanical strength of the minute projection is increased to prevent the contact part of the minute projection from being crushed with a pressure at the time of contact. Since the metal covering the minute projection has a small electric resistance, electrical contact can also be improved. A method of covering the tip end portion with a metal includes, for example, electroforming, sputtering, evaporation, or the like.

Although electrical discharge machining is applied here by way of example on the basis of the first embodiment, the tip end portion may be formed by electrical discharge machining with the steps shown in FIGS. 22 and 23. In this case, the similar effect also results.

In accordance with the first invention illustrated above, since the contact probe has a slope at the tip end portion to attain a shape sharper than the conventional, it is brought into point contact with an object of measurement, rather than linear contact, thereby increasing a contact pressure. As a result, electrical contact is more reliably assured.

FOURTH EMBODIMENT

Figure 24:
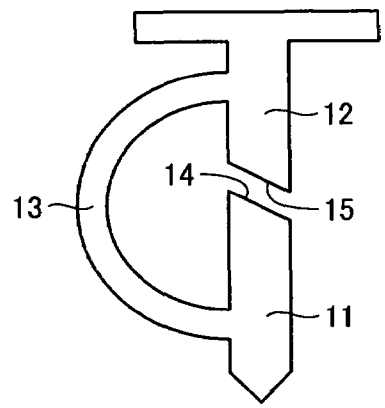
FIG. 24 is a planar view showing an example of a fourth embodiment based on the second invention.

A fourth embodiment based on the second invention will be described with reference to FIG. 24. FIG. 24 shows a planar view of a contact probe having a tip end portion 11 and a base portion 12 coupled by a coupling portion 13, which are integrally molded. Tip end portion 11 has a contact end at one end, which is brought into contact with a circuit under test. Base portion 12 is provided with a surface 15 opposed to and spaced apart from the other end 14 of the tip end portion. Tip end portion 11 actually has a shape having a thickness, though shown as a planar view in the figures, and has a cross section based on a quadrangular prism. Coupling portion 13 has a certain elasticity to allow the tip end portion and the base portion to be held with a certain space therebetween when the contact probe is not pressed against the circuit under test.

It is noted that the contact probe is formed of a metal as it has to be rendered electrically conductive. In a case of manufacturing by electroforming, nickel, cobalt, copper, or an alloy such as Ni—Co, Ni—Mn, Ni—Mo, Ni—W, Co—Mo, Co—W, or the like is particularly used. Furthermore, a contact probe as intended to be manufactured by the manufacturing method using lithography and electroforming should be a minute one having a thickness of 100 μm or smaller and a length of 1 mm or less. This applies to the configuration of each means, unless otherwise described in the following.

Figure 25A:
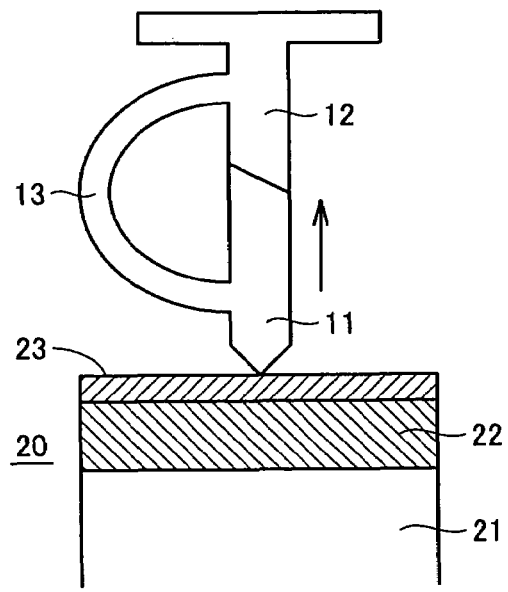
FIGS. 25A and 25B are views illustrating an action of the contact probe in FIG. 24.
Figure 25B:
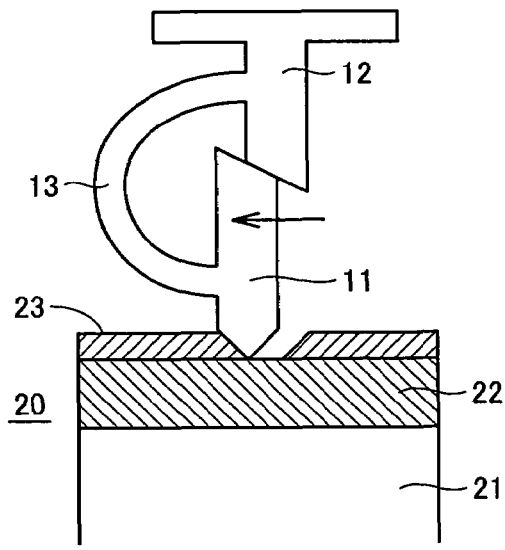

With reference to FIGS. 25A and 25B, the action of the present contact probe will be described. Circuit under test 20 is formed of a conductor 22 formed on substrate 21 and has an insulating film 23 on the surface thereof. When tip end portion 11 is pressed against the surface of circuit under test 20 by the elasticity of coupling portion 13, the opposing surfaces 14 and 15 (see FIG. 24) of tip end portion 11 and base portion 12, respectively, are brought into contact with each other (FIG. 25A). The tip end portion and the base portion are opposed to each other on a oblique plane as shown, and when further pushed, they slide on each other on the contact surfaces and then move in a direction crossing the axis. As a result, the contact end of the tip end portion is moved to the direction parallel to the surface of the circuit under test to scrape off a part of insulating film 23 of this surface.

Figure 26A:
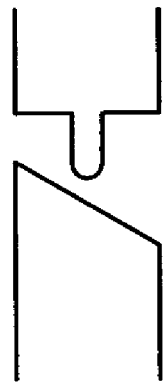
FIGS. 26A, 26B and 26C are views schematically showing exemplary configurations of a part of the contact probe in FIG. 24.
Figure 26B:
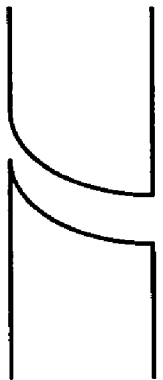
Figure 26C:
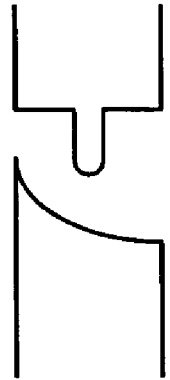

It is noted that although in this example the opposed surfaces of the tip end portion and the base portion are parallel to each other, they may be a combination causing sliding in the direction orthogonal to the axis when pressed against each other, as schematically shown in FIGS. 26A, 26B, and 26C, for example, such as a combination of one having a planar surface and the other having a projecting shape (FIG. 26A), a combination of curved surfaces (FIG. 26B), a combination of a curved surface and a projection (FIG. 26C), or the like.

FIFTH EMBODIMENT

Figure 27A:
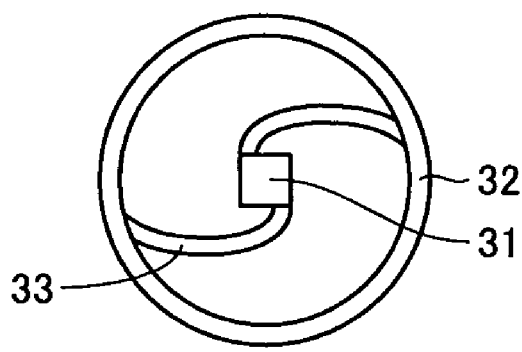
FIGS. 27A and 27B are views showing an example in a fifth embodiment based on the second invention, FIG. 27A showing a top view and FIG. 27B showing a front view.
Figure 27B:
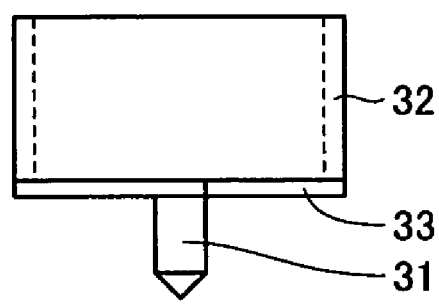

An exemplary structure of a contact probe in accordance with a fifth embodiment based on the second invention is shown in FIGS. 27A and 27B. FIG. 27B is a front view and FIG. 27A is a view seen from above. A tip end portion 31 having a contact end with respect to a circuit under test is fixedly connected by means of two coupling portions 33 to a cylindrical base portion 32 arranged concentrically with respect to the axis of the tip end portion. Each coupling portion 33 is curved, shaped like an approximately circular arc as seen from the direction in FIG. 27A, and is adhesively fixed to the tip end portion and the base portion in the same circumferential direction to support tip end portion 31 with a certain spring force.

Figure 28:
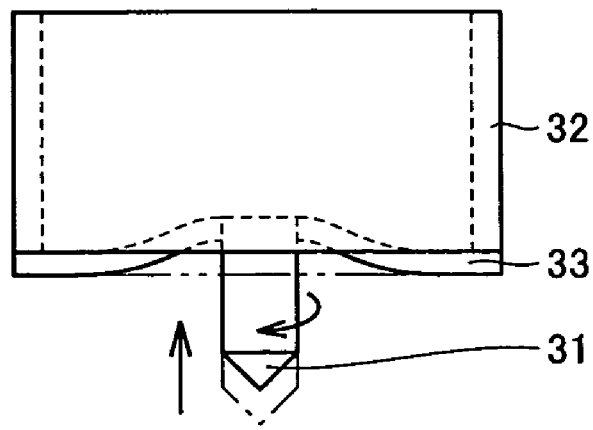
FIG. 28 is a view illustrating an action of the contact probe in FIGS. 27A and 27B.

FIG. 28 shows this contact probe pressed against a circuit under test. In FIG. 28, the phantom line shows the state before pressing, the solid line shows the state of pressing, and the broken line shows the part which is hidden in the tubular base portion. When the contact probe is pressed into contact, coupling portion 33 is deformed in the pressing direction. Here, as the coupling portion has a certain length, it deforms in the curved shape extending direction, thereby resulting in a rotation of tip end portion 31. This rotation facilitates the breakage of the insulating film on the surface of the circuit under test to obtain good electrical contact.

SIXTH EMBODIMENT

Figure 29:
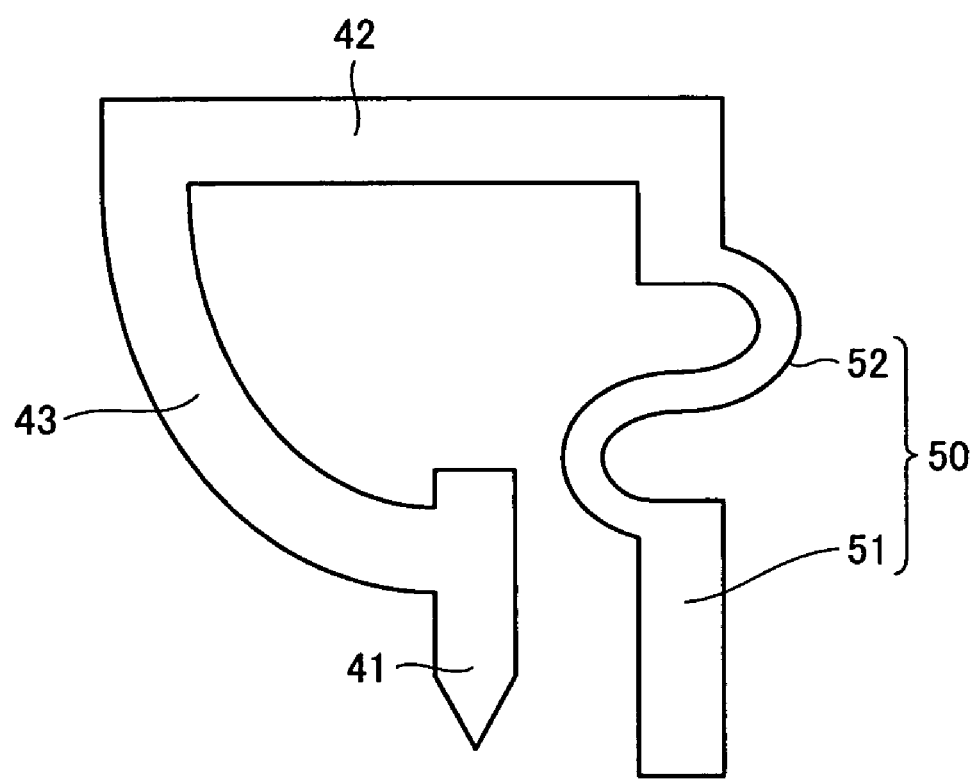
FIG. 29 is a planar view showing an example in a sixth embodiment based on the second invention.

Referring to FIG. 29, a contact probe in a sixth embodiment based on the second invention will be described. FIG. 29 shows a planar view of the contact probe. A body portion is integrally formed of a tip end portion 41 having a contact end, a coupling portion 43 having elasticity, and a base portion 42, which is shared with a support portion 50 integrally formed. Support portion 50 is formed of a contact portion 51 to be brought into contact with a circuit under test and a spring portion 52 having elasticity. It is optional whether tip end portion 41 of the body portion or contact portion 51 of support portion 50 first comes into contact with the circuit under test, although in this example support portion 51 first comes into contact, and the friction on the tip end of support portion 51 prevents sliding of the contact probe on the circuit under test, followed by reliable contact of tip end portion 41. Here, it is necessary that the elasticity of spring portion 52 of the support portion is weaker than the elasticity of the body portion. Otherwise, the elasticity of the support portion would hinder the contact pressure by the body portion from being exerted on the circuit under test effectively.

Although one support portion is provided beside the body portion in the present example, two or more support portions may be provided to sandwich the body portion so that the dislocation of the contact end can be prevented more reliably.

The tip end of the support portion may not be sharp in shape and may have a planar surface, a curved surface, or a convex and concave shape, since it is not intended for electrical contact but is intended to prevent dislocation. Furthermore, the material of the support portion is preferably an insulator to avoid electrical contact, but may be a metal, which is formed integrally with the body portion by electroforming. In the case of a metal, the tip end of the support portion is preferably provided with an insulating coat.

SEVENTH EMBODIMENT

Figure 30:
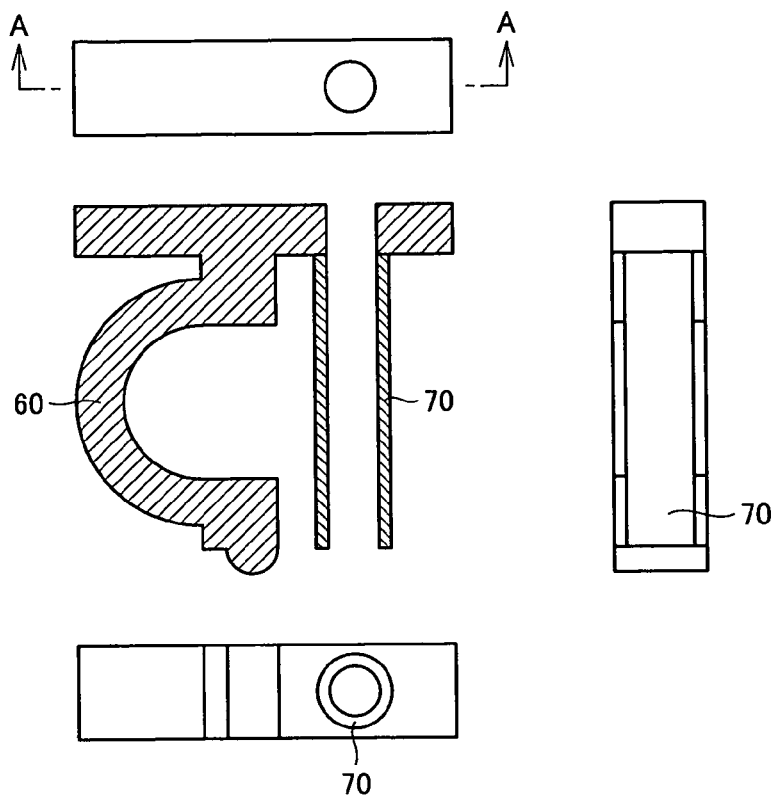
FIG. 30 is a view showing an example in a seventh embodiment based on the second invention.

Referring to FIG. 30, a contact probe in a seventh embodiment based on the present invention will be described. FIG. 30 shows an exemplary configuration of the contact probe. To clearly show the configuration of a channel, the front view is shown as A—A cross sectional view, and the top, bottom, right-side views are shown. In the vicinity of a contact probe body portion 60, a channel tube 70 for distributing a reduction gas is provided. Channel tube 70 is shaped like a micro-tube and allows the reduction gas to be introduced only in the vicinity of the contact end of the circuit under test.

Figure 31:
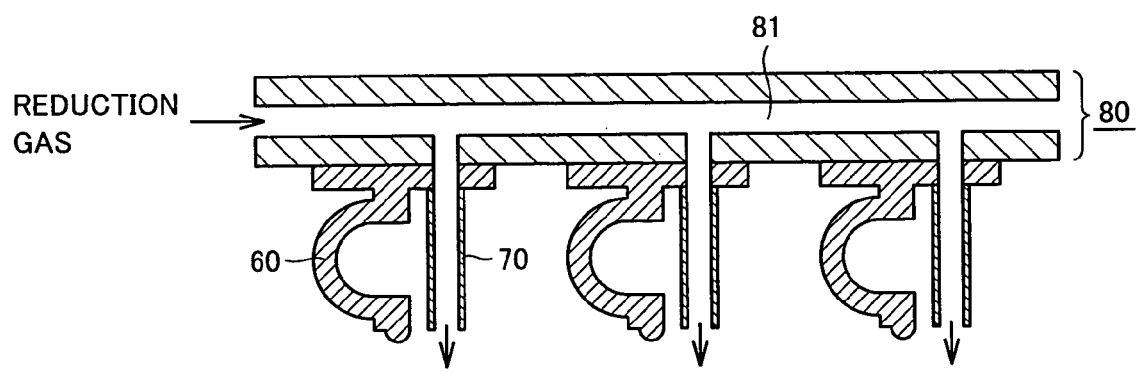
FIG. 31 is a cross sectional view schematically showing the contact probe in FIG. 30 being mounted.

FIG. 31 shows a configuration of a probe card mounted with such contact probes in cross section, and the supply of the reduction gas will now be described. FIG. 31 shows a cross section of a part in which three contact probes shown in FIG. 30 are arranged in line. The electrical interconnections to the contact probes are provided independently of each other within a probe card substrate 80 (not shown). Channel tubes 70 each forming a reduction gas channel provided for each contact probe lead through the holes in probe card substrate 80 to a common channel 81 provided in the probe card substrate. The common channel is supplied with a reduction gas to allow the reduction gas to be introduced in the vicinity of each contact portion (as indicated by the arrow in the drawing). Here, the same effect can be achieved by a configuration in which, without tubular body 70, the common channel in the probe card and the hole in the substrate let the reduction gas flow into the vicinity of each contact probe, although it is more preferable to provide the tubular body.

Figure 32:
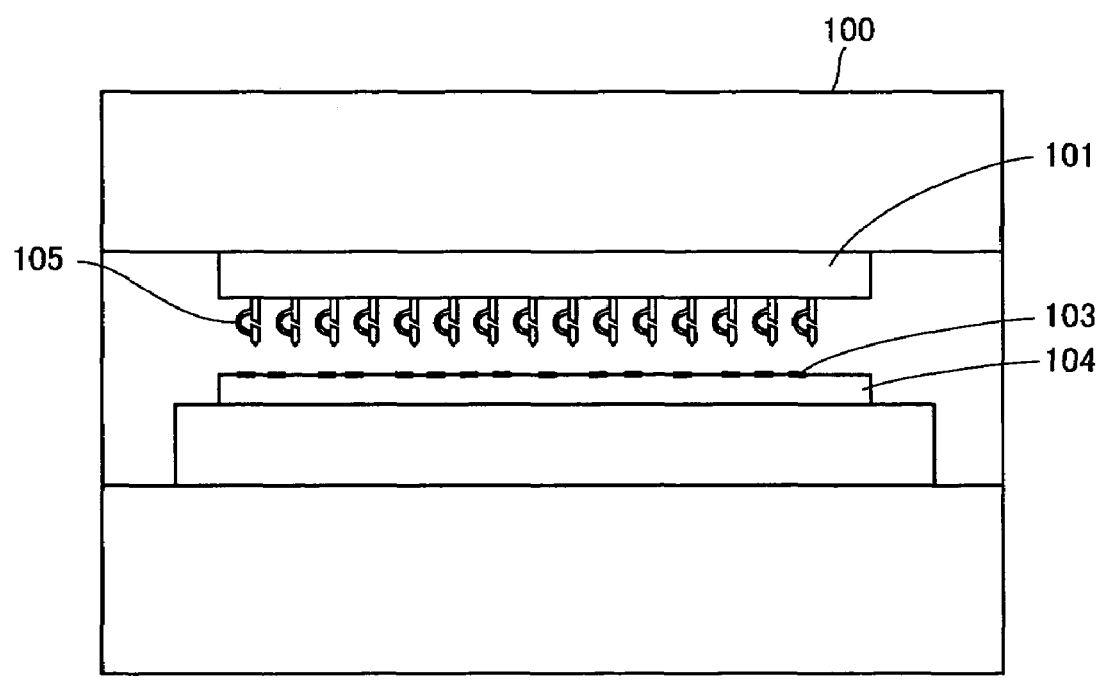
FIG. 32 is a cross sectional view showing an exemplary test apparatus based on the second invention.

FIG. 32 shows a test apparatus with the aforementioned contact probes. A test apparatus 100 includes a probe card substrate 101 on which a number of contact probes 105 are arranged. When an IC substrate 104 having a circuit under test 103 on the surface thereof is installed in a chamber, contact probe 105 relatively approaches circuit under test 103 and comes into contact therewith for a test. Any of the contact probes shown in FIGS. 24, 26A–26C, 27A, 28, 29, and 30 may be provided as contact probe 105.

Figure 33:
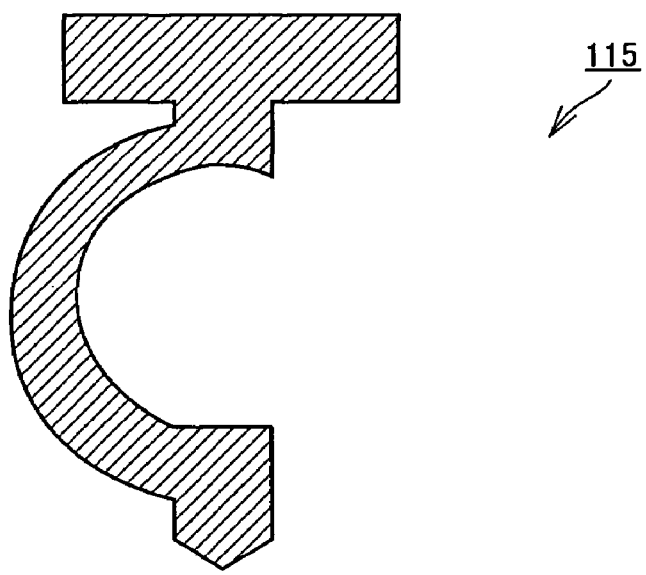
FIG. 33 is a planar view of a contact probe for a test apparatus based on the second invention.
Figure 34:
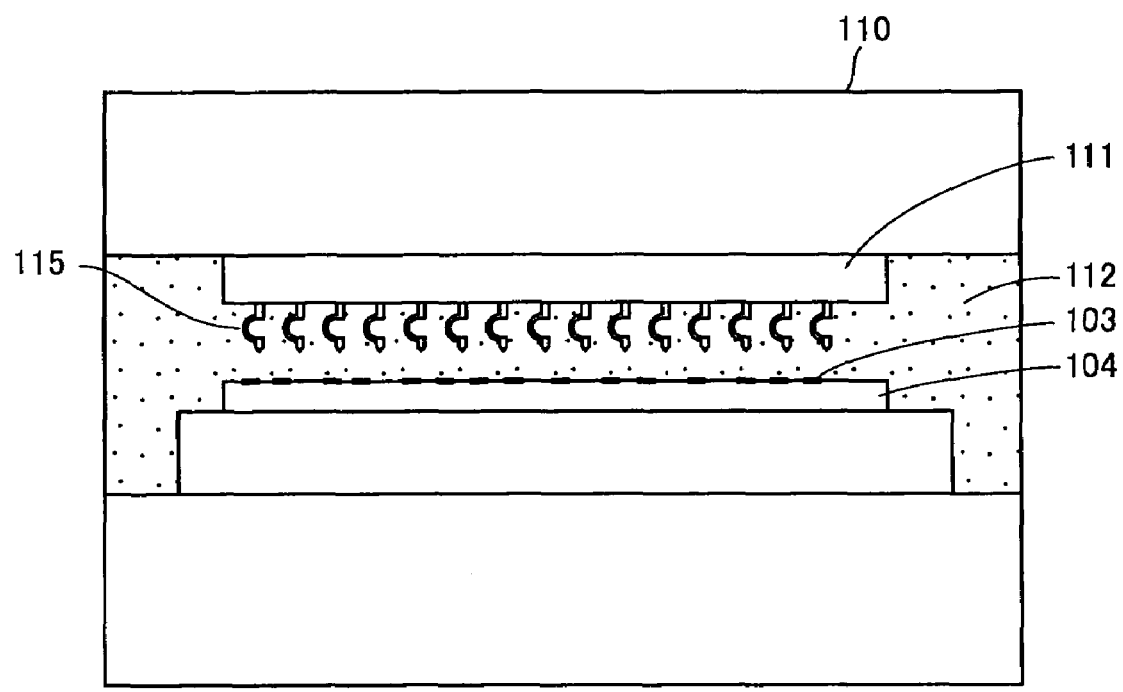
FIG. 34 is a cross sectional view showing another exemplary test apparatus based on the second invention.
Figure 35:
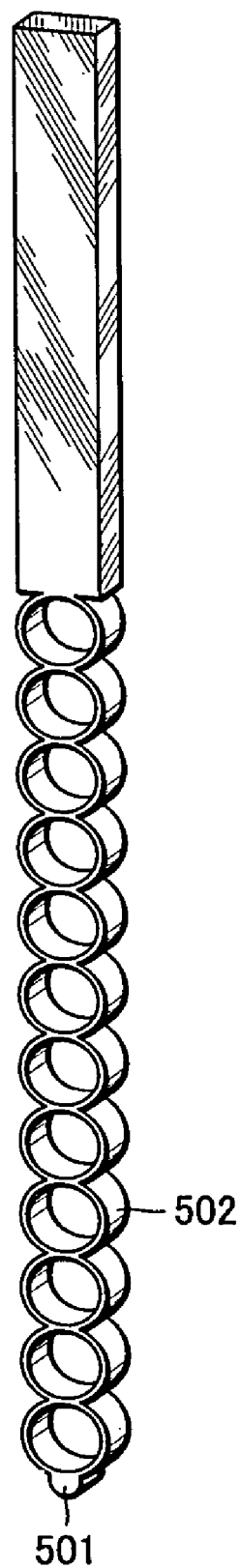
FIG. 35 is a perspective view of a first exemplary contact probe based on the conventional technique.
Figure 36:
FIG. 36 is a planar view of a mask pattern corresponding to the first exemplary contact probe based on the conventional technique.
Figure 37:
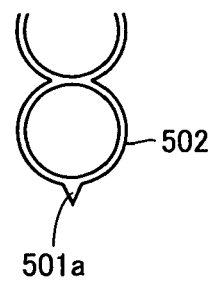
FIG. 37 is an enlarged planar view of a tip end portion of a mask pattern corresponding to a second exemplary contact probe based on the conventional technique.
Figure 38:
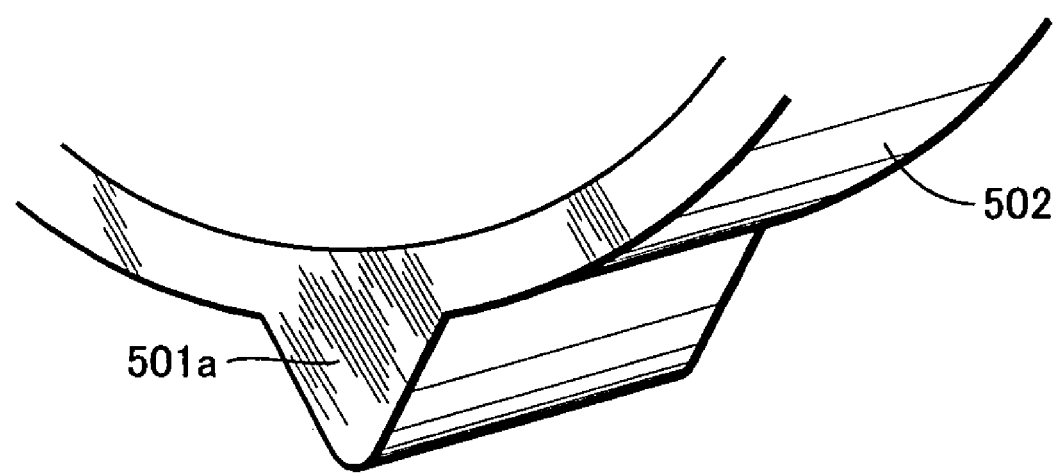
FIG. 38 is an enlarged perspective view of a tip end portion of the second exemplary contact probe based on the conventional technique.
Figure 39:
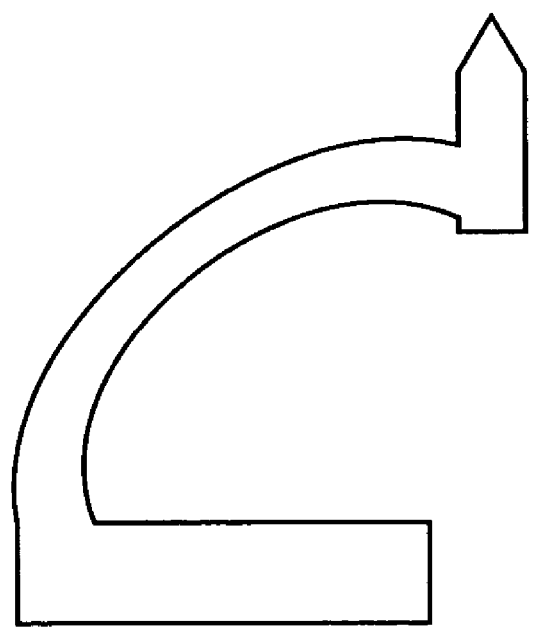
FIG. 39 is a planar view of a mask pattern corresponding to a third exemplary contact probe based on the conventional technique.
Figure 40:
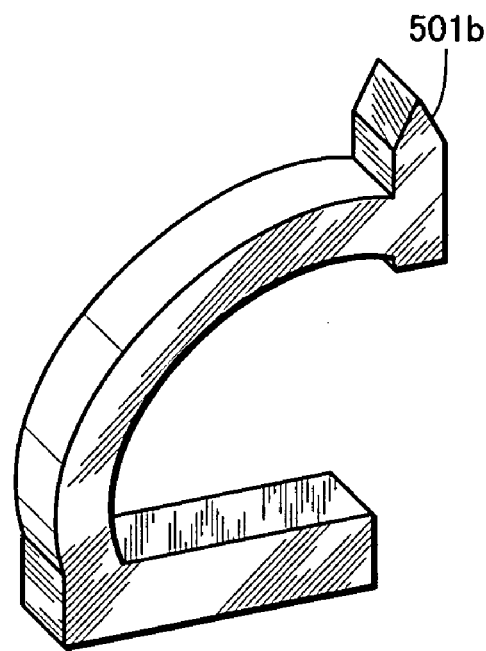
FIG. 40 is a perspective view of the third exemplary contact probe based on the conventional technique.
Figure 41A:
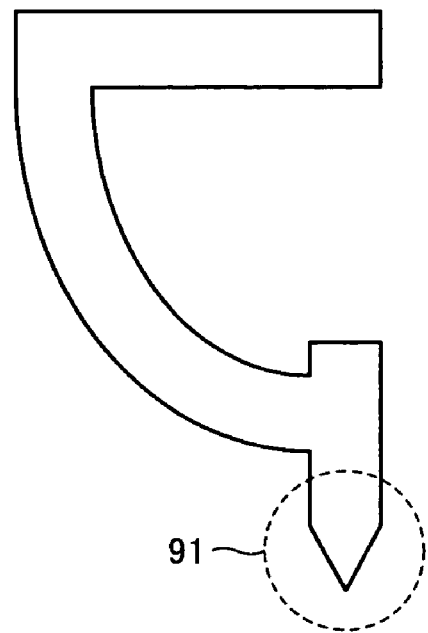
FIGS. 41A and 41B are views showing an exemplary contact probe manufactured by lithography and electroforming, FIG. 41A showing a planar view and FIG. 41B showing a perspective view of a tip end portion.
Figure 41B:
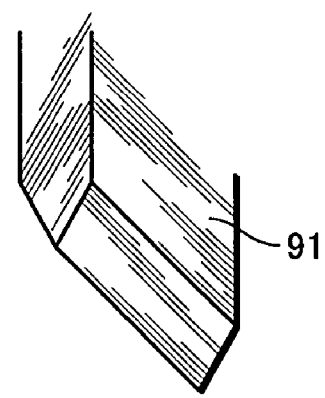

FIG. 33 shows a contact probe 115. Contact probe 115 differs from the contact probe shown in FIG. 30 in that it does not include a channel tube. FIG. 34 shows a test apparatus including this contact probe 115. Test apparatus 110 includes a probe card substrate 111 on which a number of contact probes 115 are arranged. When IC substrate 104 having circuit under test 103 on the surface thereof is installed in a chamber, the chamber is filled with a reduction gas by a reduction gas introducing means (not shown) of the prior art. As a result, circuit under test 103 is exposed in the environment of reduction gas 112. In this state, contact probe 115 relatively approaches circuit under test 103 to come into contact therewith for a test.

In accordance with the second invention as illustrated above, a contact probe is provided that has a simple structure to break the insulating film on the surface of the circuit under test even with a low contact pressure, thereby achieving appropriate electrical contact, and it may be manufactured, for example, by lithography and electroforming.

It is noted that the embodiments above are disclosed herein by way of illustration, not by way of limitation. The scope of the invention is shown not in the forgoing description but in the claims and all equivalence to and modification within the claim may be embraced herein.

INDUSTRIAL APPLICABILITY

A contact probe based on the present invention can be incorporated in a test apparatus for use in an electrical test of a semiconductor substrate, a liquid crystal display, or the like.

The invention claimed is:

1. A method of manufacturing a contact probe, comprising:
    an electroforming step that comprises, using a pattern frame having a shape corresponding to a contact probe and arranged on a substrate, performing electroforming to fill a gap of said pattern frame to form a metal layer;
    a tip end shaping step that comprises obliquely removing and sharpening a tip end of said metal layer that is to serve as a tip end portion of said contact probe, comprising cutting said tip end of said metal layer by electrical discharge machining; and
    a take-out step of taking out only said metal layer from said pattern frame.

2. The method of manufacturing a contact probe according to claim 1, wherein said tip end shaping step includes a step of providing a projection using an electrical discharge machining mark on a machined surface formed by said electrical discharge machining.

3. The method of manufacturing a contact probe according to claim 2, wherein said machined surface is covered with a metal having a hardness higher than that of a surface of said machined surface and having an electric resistance smaller than that of a material forming the surface of said machined surface.

4. The method of manufacturing a contact probe according to claim 1, wherein said pattern frame is formed by forming a pattern by lithography on a resist film formed on said substrate.

5. The method of manufacturing a contact probe according to claim 1, wherein said pattern frame is made of a resin molded using a metal die.

6. A method of manufacturing a contact probe, comprising:
    an electroforming step that comprises, using a pattern frame having a shape corresponding to a contact probe and arranged on a substrate, performing electroforming to fill a gap of said pattern frame to form a metal layer;
    a tip end shaping step that comprises obliquely removing and sharpening a tip end of said metal layer that is to serve as a tip end portion of said contact probe, comprising a cutting process selected from the group consisting of: cutting said tip end of said metal layer by electrical discharge machining, or cutting a boundary between said pattern frame and said metal layer along said tip end using a rotary cutting edge having an outer edge that is V-shaped in cross section; and
    a take-out step of taking out only said metal layer from said pattern frame.

7. The method of manufacturing a contact probe according to claim 6, wherein said cutting process comprises said cutting of said boundary using said rotary cutting edge.

8. The method of manufacturing a contact probe according to claim 7, wherein said pattern frame is formed by forming a pattern by lithography on a resist film formed on said substrate.

9. The method of manufacturing a contact probe according to claim 7, wherein said pattern frame is made of a resin molded using a metal die.

* * * * *

UNITED STATES PATENT AND TRADEMARK OFFICE
CERTIFICATE OF CORRECTION

PATENT NO. : 7,151,385 B2
APPLICATION NO. : 10/470399
DATED : December 19, 2006
INVENTOR(S) : Hirata et al.

It is certified that error appears in the above-identified patent and that said Letters Patent is hereby corrected as shown below:

Title page, Item [54] and Column 1, Lines 1 to 4,
replace "CONTACT PROBE, METHOD OF MANUFACTURING THE CONTACT PROBE, AND DEVICE AND METHOD FOR INSPECTION" by --CONTACT PROBE AND METHOD OF MANUFACTURING THE SAME AND TEST APPARATUS AND TEST METHOD--;

Column 2,
Line 48, after "an", replace "electrotorming" by --electroforming--;

Column 5,
Line 62, after "the", delete --.--.

Signed and Sealed this

Twenty-sixth Day of June, 2007

JON W. DUDAS
*Director of the United States Patent and Trademark Office*